United States Patent [19]

Fujiwara et al.

[11] 4,020,225

[45] Apr. 26, 1977

[54] METAL CLAD LAMINATE COMPOSED OF FLAME RESISTANT THERMOSETTING RESIN COMPOSITION

[75] Inventors: Hiroshi Fujiwara, Soka; Hiroshi Suzuki, Ichikawa, both of Japan

[73] Assignee: Maruzen Oil Co. Ltd., Osaka, Japan

[22] Filed: Nov. 18, 1975

[21] Appl. No.: 633,134

Related U.S. Application Data

[62] Division of Ser. No. 548,108, Feb. 7, 1975.

[52] U.S. Cl. .................... 428/251; 106/15 FP; 260/DIG. 24; 260/836; 260/837 R; 428/252; 428/271; 428/417; 428/432; 428/441; 428/442; 428/444; 428/457; 428/510; 428/901; 428/921

[51] Int. Cl.² .................................. B32B 15/12

[58] Field of Search ........ 260/836, 837 R, DIG. 24; 428/247, 251, 261, 271, 273, 285, 318, 451, 920, 921, 901, 417, 432, 441, 442, 444, 457, 510; 106/15 FP

[56] References Cited

UNITED STATES PATENTS

| | | | |
|---|---|---|---|
| 3,050,476 | 8/1962 | Tress et al. | 260/2.5 |
| 3,741,858 | 6/1973 | Fujiwara et al. | 428/901 |
| 3,884,992 | 5/1975 | Shimizu | 260/836 |

*Primary Examiner*—James J. Bell
*Attorney, Agent, or Firm*—Sughrue, Rothwell, Mion, Zinn & Macpeak

[57] ABSTRACT

A thermosetting resin composition having excellent flame resistance and thermal stability comprising an epoxy resin and a halogenated polyhydroxystyrene and a metal clad laminate comprising at least one planar base material having impregnated therein the above-described flame resistant thermosetting resin composition and at least one metal foil laminated thereon.

11 Claims, No Drawings

METAL CLAD LAMINATE COMPOSED OF FLAME RESISTANT THERMOSETTING RESIN COMPOSITION

This is a division of application Ser. No. 548,108, filed Feb. 7, 1975.

BACKGROUND OF THE INVENTION

1. Field of the Invention

The present invention relates to a novel flame resistant resin composition comprising an epoxy resin and a halogenated polyhydroxystyrene and further a novel metal clad laminate prepared using the above-described flame resistant thermosetting resin composition.

2. Description of the Prior Art

Hitherto, as flame retardants for epoxy resins and other resins, addition-type flame retardants such as low molecular weight halides, antimony trioxide, and phosphorus compounds are generally used but since these addition-type flame retardants not only adversely influence the properties of the resins to which the flame retardants are added but also recently have caused large problems due to their toxicity, reactive type flame retardants or further flame retarding high molecular weight compounds have tended to be employed in place of these addition-type flame retardants. That is, by employing high molecular weight flame retardants in place of low molecular weight flame retardants, the properties of the resins containing the flame retardants can be improved and stabilized and also the adverse influences on humans can be greatly reduced, that is, such high molecular flame retardants are not toxic to humans.

From such a standpoint, investigations on the development of flame retarding epoxy-phenol type thermosetting resins based on the fact that a halogenated polyhydroxystyrene is not only a reactive type resin but also simultaneously a high molecular type resin and as the result of these investigations it has been found that the flame resistance of the epoxy-phenol type resins as previously provided by Japanese Patent Application No. 109,675/'72 can be further improved by using the above-described halogenated polyhydroxystyrene.

Furthermore, with the recent rapid development of the electronic industry, a metal clad laminate for printing circuit use has become an important component of electronic equipment. Hitherto, most metal clad laminates are those composed of papers and phenol resins produced by high pressure molding but these paper-phenol resin type metal clad laminates have the disadvantages that their electric properties vary greatly depending on changes in temperature and humidity, they are deformed greatly by heat or by changes in humidity, which causes operational difficulties due to imperfect contact, and further they lack sufficient thermal stability for soldering and sufficient chemical resistance. Accordingly, it becomes difficult to provide the required properties increasingly rapidly demanded in the fields of household appliances, industry, and communications. Thus, the demand for epoxy resin metal clad laminates employing glass cloths or glass mats as the base material which do not have these disadvantages has recently greatly increased and further it has keenly been desired that metal clad laminates have not only improved thermal stability at soldering but also excellent flame resistance so that the efficiency of the soldering operation could be improved and also so that safety and reliability could be improved.

It has also been further confirmed that a flame retarding composition comprising an epoxy resin and a halogenated polyhydroxystyrene has also excellent electrical properties and high reliability as commercial products. Thus, on considering the above-described recent situations on metal clad laminates, the possibility of the application of the above-described flame retarding composition for the metal clad laminates has been further investigated for meeting the increasing requirements of the properties of metal clad laminates, in particular, high thermal stability at soldering, high flame resistance and high reliability as commercial products, and as the result of these investigations metal clad laminates having excellent thermal stability and flame resistance as well as high reliability have been successfully obtained by using a material impregnated with the flame retarding resin composition as a base material for metal clad laminates.

SUMMARY OF THE INVENTION

Thus, according to this invention, there is first provided a novel flame resistant thermosetting resin composition comprising an epoxy resin and a halogenated polyhydroxystyrene.

Furthermore, according to another embodiment of this invention there is provided a metal clad laminate comprising at least a base material impregnated with the above-described flame resistant thermosetting resin composition and at least a metal foil or sheet laminated thereon.

DETAILED DESCRIPTION OF THE INVENTION

The halogenated polyhydroxystyrene used in the composition of this invention can be a halogenated polyhydroxystyrene having a broad range of mean degrees of polymerization, i.e., a mean degree of polymerization ranging from 2 (dimer) to 10,000 but from the standpoints of the curing operation and the properties of the hardened products it is preferable to use a halogenated polyhydroxystyrene having a mean degree of polymerization of from about 10 to 150. Furthermore, any degree of halogenation can be employed in this invention but since a too low halogenation degree reduces the flame resistance or flame retarding property imparted, it is preferable to use a halogenated polyhydroxystyrene having the halogen content of about 30 to 60% by weight, for example, bromine or chlorine. The monomer unit for the halogenated polyhydroxystyrene used in this invention may be a halogenated o-hydroxystyrene, m-hydroxystyrene, or p-hydroxystyrene or can be a mixture of these halogenated hydroxystyrenes. Moreover, the halogen in the polymer can be the same halogen or a mixture of halogens. Still further, the halogenated hydroxystyrene used in this invention can be a mixture of a halogenated hydroxystyrene and hydroxystyrene.

The halogenated polyhydroxystyrene which is one component of the novel composition of this invention can be prepared in the following manner. That is, polyhydroxystyrene is first prepared from hydroxystyrene by, e.g., a thermal polymerization, an ionic polymerization, or a radical polymerization or alternatively polyhydroxystyrene is prepared by polymerizing an acylhydroxystyrene or an alkoxystyrene and then hydrolyzing the polymerization product thus obtained. The halogenated polyhydroxystyrene is prepared by reacting the polyhydroxystyrene thus prepared with a conventional halogenating agent such as molecular chlorine, bromine, or iodine or further N-bromosuccinimide or chloramine T. Preferred halogen atoms in the halogenated polyhydroxystyrene are bromine, chlorine or a mixture thereof. For example, a halogenated polyhydroxystyrene can be easily produced with a desired degree of halogen substitution by dissolving uniformly the polyhydroxystyrene in methanol and then adding thereto molecular bromine or bubbling gaseous molecular chlorine into the solution. By appropriately selecting the reaction conditions for the halogenation or according to the kind of halogen to be employed, the halogen can be introduced into the polymer in an amount ranging from about 15 to 70% by weight but in the case of blending the halogenated polymer with an epoxy resin, a brominated polyhydroxystyrene having a halogen content of 30 to 60% by weight or a brominated polyhydroxystyrene in which less than about 30 mole percent of bromine has been replaced by chlorine is most generally used.

The epoxy resin blended with the halogenated polyhydroxystyrene can be anyone of the so-called epoxy resins which are generally used and mainly comprise compounds having at least two epoxy groups per molecule. These epoxy resins can further be anyone of the saturated or unsaturated aliphatic, cycloaliphatic, aromatic or heterocyclic epoxy resins, and if desired, can be substituted by one or more substituents which have no influence on producing and hardening the composition, such as a halogen atom, a hydroxyl group, an ether group, an ester group and/or a metal atom.

Representative examples of preferred epoxy resins are, for example, the following compounds:

1. Polyglycidylethers obtained by etherification of polyhydric alcohols or polyhydric phenols with epichlorohydrin or dichlorohydrin in the presence of alkaline agents, which include glycidylethers (bisphenol type epoxy resins) derived from bis(p-hydroxyphenyl)-methane, bis-(p-hydroxyphenyl)-dimethylmethane, bis-(p-hydroxyphenyl)-methylphenylmethane, bis-(p-hydroxyphenyl)-tolylmethane, 4,4'-dihydroxy-diphenyl, bis-(p-hydroxyphenyl)-sulfone, etc.; glycidylethers (polyhydroxybenzene type epoxy resins) derived from resorcin, catechol, hydroquinone, etc.; glycidylethers (polyphenol type epoxy resins) derived from 1,1,3-tris-(p-hydroxyphenyl)-propane, 1,1,2,2-tetrakis-(p-hydroxyphenyl)-ethane, 1,1,5,5-tetrakis-(p-hydroxyphenyl)-pentane, etc.; glycidylethers (novolak or resole type epoxy resins) derived from novolaks or resoles or the like produced by the condensation of phenol and formaldehyde; and glycidylethers (polyglycol type epoxy resins) derived from ethylene glycol, diethylene glycol, triethylene glycol, 1,3-propylene glycol, 1,4-butylene glycol, 1,5-pentane-diol, 1,6-hexane-diol, 2,4,6-hexane-triol, glycerin, etc.

2. Polyglycidyl esters (carboxylic acid type epoxy resins) formed by the reaction of polycarboxylic acids with epichlorohydrin or dichlorohydrin in the presence of alkaline agents; these polyesters are derived, for example, from aliphatic dicarboxylic acids such as succinic acid, adipic acid, etc.; aromatic dicarboxylic acids such as phthalic acid, terephthalic acid, etc.; or polymers of unsaturated fatty acids, such as linoleic acid, etc.

3. Cycloaliphatic polyepoxides (cycloaliphatic type epoxy resins) such as vinyl cyclohexenedioxide, limonenedioxide, dicyclopentadienedioxide, ethyleneglycol-bis-(3,4-epoxy-tetrahydrodicyclopentadien-8-yl)-ether, (3,4-epoxy-tetrahydrodicyclopentadien-8-yl)-glycidylether, diethyleneglycol-bis-(3,4-epoxy-cyclohexanecarboxylate), bis-(3,4-epoxy-cyclohexylmethyl)-succinate, 3,4-epoxy-6-methylcyclohexylmethyl-3,4-epoxy-6-methylcyclohexanecarboxylate, 3,4-epoxy-hexahydrobenzal-3,4-epoxy-cyclohexane-1,1-dimethanol, etc.

4. Basic polyepoxy compounds (nitrogen-containing epoxy resins) obtained by the reaction of aliphatic or aromatic primary or secondary diamines such as aniline, toluidine, 4,4'-diaminodiphenylmethane, 4,4'-di-(monomethylamino)-diphenylmethane, 4,4'-diaminodiphenylsulfone, etc. with epichlorohydrin in the presence of alkaline agents.

5. (Diene type epoxy resins) such as epoxidized dienes, epoxidized polybutadiene or epoxidized copolymers of butadiene and ethylenically unsaturated compounds such as styrene or vinyl acetate with butadiene, etc.

In the present invention, mixtures of these epoxy resins can be used.

Of these epoxy resins, the bisphenol type epoxy resins are preferably used, since various kinds of these resins having various molecular weights are readily available and further the applications of these bisphenol epoxy resins is extremely broad.

In the composition of this invention the above-described halogenated polyhydroxystyrene and the expoxy resin are the necessary components but the composition of this invention can contain other components, if desired. One of there other components constituting the skeleton of the resin composition of this invention is polyhydroxystyrene. In other words, the use of a polymer blend of a halogenated polyhydroxystyrene and polyhydroxystyrene is also within the scope of this invention.

The resin composition of this invention is generally prepared by uniformly mixing the halogenated polyhydroxystyrene and the epoxy resin and the mixing ratio of both components can be varied depending on the purposes of the composition. However, if the equivalent ratio of the hydroxyl group contained in the halogenated polyhydroxystyrene or a mixture of the halogenated polyhydroxystyrene and polyhydroxystyrene, when such a mixture is used, in the resin composition to the epoxy group contained in the epoxy resin in the resin composition (i.e., hydroxyl group/epoxy group equivalent ratio) is too small or too large, the degree of cross-linking of the hardened product of the resin composition decreases and hence the hardened product of the resin composition retains a thermoplastic property and sufficient strength is not obtained. Therefore, the ratio of the number of the phenolic hydroxyl group to the number of the epoxy group in the resin composition of this invention preferably is in the range of 0.3 to 10, more preferably 0.5 to 5, and it is desirable to appropriately select this ratio within the range described above depending upon the desired end-use purpose.

The composition of this invention can be in various forms, for example, the composition can be in the form of a liquid or a solid depending on the states of the halogenated polyhydroxystyrene, the epoxy resin, etc., used for preparing the composition. Furthermore, the composition of this invention can be used as a solution in an organic solvent which dissolves the halogenated polyhydroxystyrene and the epoxy resin forming the composition, for example, ketones such as acetone, methyl ethyl ketone and methyl isobutyl ketone, esters such as methyl acetate, ethyl acetate, butyl acetate and amyl acetate, ethers such as tetrahydrofuran and dioxane, etc. As described above, the composition of this invention can contain, in addition to the necessary components, that is the halogenated polyhydroxystyrene and the epoxy resin, other components, if desired, such as various dyes, pigments, plasticizers, reinforcing agents, fillers, etc.

Conventional plasticizers can be used in the present invention. Suitable examples are glycerin, nitrobenzene, phthalic anhydride, benzoic anhydride, stearic acid, stearates, dibutylphthalate, tricresylphosphate, alkylphenols, alkyldiphenyl benzene, rosin, etc. The amount of the plasticizer employed is generally 0.5 to 20 wt% based on the weight of the resins in the composition.

Conventional reinforcing agents can be used in the present invention. Suitable examples of these reinforcing agents are papers, asbestos papers, synthetic fibers, glass fibers, graphite fibers, metallic fibers, etc. An appropriate amount of the reinforcing agent used is 20 to 900 phr. based on the weight of the resin composition.

Conventional fillers can also be used in the present invention. Suitable examples of such are silicas, quartz, aluminas, calcium carbonate, mica, talc, graphite, cements, clays, asbestos, gypsum, metallic powders, etc. The amount of the filler used is less than 900 phr based on the weight of the resin composition.

The curing or hardening of the composition of this invention is carried out by heating the composition of this invention to a temperature of about 150° to 250° C for from about 30 minutes to 4 hours. To decrease the curing period of time and to obtain the characteristic properties of the hardened product of the composition of this invention, it is generally desirable to use a hardening accelerator used for hardening or curing epoxy-phenol type compositions. Examples of suitable hardening eccelerator which can be used for this purpose are tertiary amines such as dimethylaminobenzaldehyde, dimethylbenzylamine, triethanolamine, etc.; polyamines such as diethylenetriamine, etc.; urea; dicyandiamide; dimethylformamide; and the like. These hardening accelerators exhibit either no or a quite weak hardening acceleration action for an epoxy resin alone but are quite effective for accelerating the reaction of phenolic hydroxyl groups and epoxy groups.

The composition of this invention can be used for various purposes and in various forms, such as a coating composition, a molding, a laminate, etc., as well as a base material for a metal clad laminate which is another embodiment of this invention. For example, a flat coating film of the composition of this invention can be formed on a support by dissolving the composition in an appropriate solvent and coating the support with the solution of the composition of this invention followed by drying and heating or alternatively by placing a powder of the composition of this invention on a support and compressing and heating the powdery composition.

Furthermore, a casting of the composition of this invention can be obtained by melting the composition of this invention by directly heating it to a temperature at which the composition is not hardened, pouring the molten composition into a mold, and heating the composition in the mold to the curing temperature.

Also, for producing composite articles using the composition of this invention, the composition of this invention first is melted under heating to a temperature below the curing temperature of the composition or is dissolved in an appropriate solvent, a reinforcing material such as organic fibers, graphite fibers, glass fibers, asbestos, slag wool, etc. is impregnated with the molten composition or the solution of the composition, and the solvent is removed, when a solution of the composition is used, in an appropriate manner to provide, as the case may be, a so-called bulk molding compound, sheet molding compound or a prepreg mat.

The impregnated material thus obtained is not tacky at room temperature (about 20°-30° C) as conventional impregnated materials for forming composite materials using a polyester resin are and thus the disadvantage of blocking does not occur with the impregnated material of this invention. Further the impregnated material is non-tacky and has an excellent storage stability. That is, the impregnated material by the composition of this invention has the advantage that the material can be handled easily. The product or material impregnated with the composition of this invention will further be explained hereinafter in regard to the base material for the metal clad laminate of this invention.

The impregnated materials thus prepared are then placed in a mold having a desired shape and heated under pressure to cure or harden the composition and to provide a composite material reinforced with a reinforcing material. In this case, the heating can be conducted at the temperature of curing of the composition of this invention but it is desirable to first precure the impregnated materials for about 3 to 30 minutes at about 120° to 160° C, and then to press-mold the materials for about 10 to 60 minutes at about 160° to 180° C, and then to post-cure the materials for about 1 to 3 hours at about 170° to 200° C. Furthermore, in informing the composite material, an inorganic filler, etc., can of course be used together as with reinforced plastics in general.

The composition of this invention is excellent in not only flame retardant property but also thermal stability, mechanical properties, and electrical properties.

The resin compositions of this invention are suitable for preparing metal clad laminates and, therefore, the present invention also relates to metal clad laminates prepared using the composition of this invention. As described above, in the metal clad laminate of this invention, the above-described resin composition is used for preparing the base material for a metal clad laminate. That is, the base material for the metal clad laminate of this invention is prepared by impregnating a thermally stable material with the above-described composition of this invention.

As described hereinbefore, the thermosetting resin composition used for preparing the impregnated base material for the metal clad laminate comprises as necessary components, a halogenated polyhydroxystyrene and an epoxy resin or a mixture of a halogenated polyhydroxystyrene and polyhydroxystyrene and an epoxy resin. In this case also, the ratio to the epoxy group contained in the epoxy resin of the hydroxyl group containing in the halogenated polyhydroxystyrene of the mixture of the halogenated polyhydroxystyrene and polyhydroxystyrene preferably is in the range of 0.3 to 10, most preferably 0.5 to 5, as described before. For example, in a composition comprising a bisphenol A-type epoxy resin having an epoxy equivalent of about 200 and a halogenated polyhydroxystyrene having a mean degree of polymerization of about 65, the ratio of the hydroxyl group to the epoxy group is preferably about 1.0 to 5.0.

In producing an impregnated base material for the metal clad material of this invention, the same techniques for producing the impregnated material with the composition of this invention described before can be applied. That is, the components of the resin composition, i.e., the halogenated polyhydroxystyrene and the epoxy resin, are dissolved in an organic solvent which dissolves both components and which is inert to the components, for example, ketones such as acetone, methyl ethyl ketone and methyl isobutyl ketone, esters such as methyl acetate, ethyl acetate, butyl acetate, ethers such as tetrahydrofuran and dioxane, etc., the viscosity of the solution is appropriately adjusted to provide a varnish for impregnation, a thermally stable base material such as a paper, a glass fiber cloth, an asbestos paper, etc., is impregnated with the varnish, and then the impregnated base material is dried at a temperature at which the resin composition is not cured completely. The concentration of the resin composition in the varnish used for impregnation is selected according to the content of the resin composition desired in the impregnated base material but an appropriate concentration generally ranges from about 10% by weight to about 80% by weight. Furthermore, the content of the resin composition in the impregnated base material is appropriately in the range of from about 10% by weight to about 80% by weight.

The drying temperature of the impregnated base material is as described above but generally ranges from room temperature to about 100° C. When a catalyst or a hardening accelerator is used to accelerate the curing or hardening of the resin composition, such is usually incorporated in the varnish when the varnish is prepared.

For producing the metal clad laminate of this invention, a metallic plate or foil is used and, as such a material, commercially available metallic foils (usually a copper foil, an aluminum foil, a Kovar foil (tradename of Westinghouse Electric, an alloy of Fe, Ni and Co), a nickel foil and the like) for epoxy resin metal clad laminates can be used per se or can be used after coating, if desired, the metallic foil with an adhesive. As adhesives, other thermally stable thermosetting resins than the resin composition of this invention can also be used but to achieve the excellent properties of the resin composition of this invention in the metal clad laminate, it is preferable to use the varnish of the above-described halogenated polyhydroxystyrene-epoxy resin composition of this invention as such an adhesive.

The metal clad laminate of this invention can be produced using the same techniques used in producing conventional metal clad laminates. For example, the above-described base materials impregnated with the halogenated polyhydroxystyrene-epoxy resin composition are laminated using an appropriate number of impregnated sheets depending on the desired thickness of the metal clad laminate, and a metallic foil or metallic foils, which may be or may not be coated with an adhesive, are superposed on one or both surfaces of the laminated base materials. The assembly is then placed between hot press plates with a mirror-finished plate and a cushion material being inserted between the base material and the hot plate, and then molded by heating under pressure. Suitable heating and pressing conditions are a temperature of about 120° to 250° C and a pressure of about 10 to 80 kg/cm$^2$ for from about 10 minutes to about 2 hours. Further the assembly is preferably post-cured for about 1 to 24 hours to about 150° to 250° C. Also, the metal clad laminate of this invention can further be produced by placing the base material or materials impregnated with the halogenated polyhydroxystyrene-epoxy resin composition between a laminate plate preliminarily prepared and a metallic sheet or foil, which is or is not coated with an adhesive, followed by heating under pressure. In this case, the laminate plate used can be one prepared by laminating an appropriate number of sheets of the halogenated polyhydroxystyrene-epoxy resin composition used in this invention followed by heating under pressure or can be a commercially available laminate of a thermosetting resin.

That is, the metal clad laminate of this invention can be produced in the same manner as the production of conventional metal clad laminates using a metallic sheet or foil or metallic sheets or foils and a resin-impregnated base material or materials comprising the halogenated polyhydroxystyrene-epoxy resin composition and a thermally stable base material or thermally stable base materials and further using, if desired, a laminate plate produced using the above-described resin composition or a commercially available thermosetting resin laminate.

The metal clad laminate of this invention has particularly excellent flame resistance and thermal stability at soldering. That is, in a conventional glass fiber-epoxy resin type metal clad laminate, the general limit is that the laminate does not expand or peel off when thermal stability at soldering is tested for 20 seconds at 260° C, while the metal clad laminate of this invention does not exhibit any abnormal change when thermal stability is tested for longer than 10 minutes at 280° C and in addition the metal clad laminate of this invention has an excellent flame retardant property. Moreover, if the components of the resin composition are appropriately selected, a metal clad laminate passing the UL 94 V-O requirements can be quite easily obtained.

Now, the resin composition of this invention and also the metal clad laminate of this invention will be further explained more specifically by the following examples but it should be understood that these examples are given only for the purpose of illustration and are not to be construed as limiting the scope of this invention. Unless otherwise indicated, all parts, percents, ratios and the like are by weight.

EXAMPLE 1

To a 50% methanol solution of poly-p-hydroxystyrene was added bromine in an amount of 3 molar times the equivalent ratio and after stirring the mixture for 6 hours at room temperature, an equivalent amount of acetone to the methanol was added to the mixture. The resultant mixture was allowed to stand for one hour and the mixture was added to water in an amount 20 times by volume the volume of the mixture to precipitate the brominated poly-p-hydroxystyrene reaction product. The polymer was recovered by filtration from the solvent, washed sufficiently with water, and dried for 24 hours at room temperature under a reduced pressure to provide a faint yellow powdery polymer having a bromine content of 51.6%. The brominated poly-p-hydroxystyrene having a mean molecular weight of 13,000 and a bromine content of 51.6% thus obtained was mixed with a bisphenolic epoxy resin, DER 331-J (having an epoxy equivalent of 189) made by Dow Chemical Co. or a bisphenolic epoxy resin, Epikote 1001 (having an epoxy equivalent of 480) made by Shell Chemical Corp. so that the phenolic hydroxyl group/epoxy equivalent ratio (-OH/EP) was 0.8, 1.0, or 1.3 and, after melting each of the mixtures by heating to 140° – 150° C, degassing was carried out under a reduced pressure. Then, 1.0 phr of p-dimethylaminobenzaldehyde was added to each of the molten mixtures. Each of the molten mixtures was poured in a glass mold coated with a silicone grease as a mold lubricant and heated for 1 hour at 160° C and further for 1 hour at 180° C to provide faint brown castings having a thickness of 3.2 mm.

Then, the heat distortion temperature of test pieces cut from each of the castings thus obtained was measured, and the results obtained are shown in Table 1.

Table 1

| Run No. | Br-PHS (wt.%) | Epoxy Resin (wt.%) DER 331-J | Epikote 1001 | -OH/EP | HDT (° C) |
|---|---|---|---|---|---|
| 1 | 52.2 | 47.8 | — | 0.8 | 139 |
| 2 | 56.7 | 43.3 | — | 1.0 | 148 |
| 3 | 63.0 | 37.0 | — | 1.3 | 152 |
| 4 | 34.3 | — | 65.7 | 1.0 | 105 |
| 5 | 40.4 | — | 59.6 | 1.3 | 109 |
| Comparison Example | 38.8 (PHS) | 61.2 | — | 1.0 | 154 |

Note:
Br-PHS: Brominated poly-p-hydroxystyrene
PHS: Poly-p-hydroxystyrene
HDT: Heat distortion temperature Furthermore, a flame retardant test was conducted on other test pieces of a thickness of 1.6 mm cut from each of the castings. The results obtained showed that all the test pieces passed the requirement of JIS C 6481 and UL 94 (V-O). Typical examples are shown in Table 2.

Table 2

| Run No. | UL 94 Burning Time* | JIS C 6481 Burning Time* | Burning Distance* |
|---|---|---|---|
| | (seconds) | (seconds) | (mm) |
| 2 | 2 (maximum 5) | 2 | 5 |
| 4 | 4 (maximum 8) | 4 | 13 |
| Comparison Example | — | 47 | 20 |

*Mean value

EXAMPLE 2

Brominated poly-p-hydroxystyrene having a mean molecular weight of 7500 and a bromine content of 40.0% by weight was mixed with a cycloaliphatic epoxy resin CX-221 (having an epoxy equivalent of 137) made by Chisso Co. so that the phenolic hydroxyl group/epoxy equivalent ratio was 1.0 or 1.3 and was molded as in Example 1 to provide a molding. The heat distortion temperature was measured on test pieces cut from each of the castings and further a flame retardant test was conducted on each of the test pieces. The results obtained are shown in Table 3 and Table 4.

Table 3

| Run No. | Br-PHS (wt.%) | Epoxy Resin CX-221 (wt.%) | -OH/EP (equivalent ratio) | HDT (° C) |
|---|---|---|---|---|
| 6 | 59.4 | 40.6 | 1.0 | 160 |
| 7 | 65.5 | 34.5 | 1.3 | 165 |

Table 4

| Run No. | UL 94 Burning Time* | JIS C 6481 Burning Time* | Burning Distance |
|---|---|---|---|
| | (seconds) | (seconds) | (mm) |
| 6 | 4 (7)** | 4 | 12 |
| 7 | 3 (6) | 3 | 10 |

*Mean value.
**The figure in the parenthesis means the maximum value.

EXAMPLE 3

Brominated poly-p-hydroxystyrene as used in Example 1 was dissolved in acetone together with DER 331-J or Epikote 1001 and p-dimethylaminobenzaldehyde in the ratio as shown in Table 5 to provide a 50% solution of the polymers. A glass fiber cloth (Plain Woven KS-1600/S-920L made by Kanebo-Stevens Co.) was immersed in each of the solutions and after allowing the cloth to stand for 2 hours at room temperature, each of the impregnated cloths was precured at 150° C for 4 minutes (in case of Laminate No. 1 and No. 2) and 20 minutes (in case of Laminate No. 3), respectively, to provide prepreg cloths. The prepreg cloths thus obtained were not tacky and had good workability. Then, the 18 prepreg cloths thus prepared were laminated, pressed for 15 minutes at 160° to 170° C under a pressure of about 50 kg/cm² without a frame, and then post-cured in an oven for 105 minutes at 170° C. The laminates thus formed contained no bubbles, which showed the good degassing properties of the composition of this invention. A test piece of a size of 25 mm × 80 mm × 3 mm was cut from each of the laminates thus obtained and the flexual strength and the flexural modulus of each of the test pieces were measured. Furthermore, the retention percentage of the bending strength at a temperature of 150° C was measured. The results obtained are shown in Table 5.

Table 5

| Laminate No. | Br-PHS (wt.%) | Epoxy Resin Kind | (wt.%) | -OH/EP | Flexural Strength (Kg/mm²) | Flexural Modulus (Kg/mm²) | High-Temperature Strength (150° C) Flexural Strength (Kg/mm²) | Retention (%) |
|---|---|---|---|---|---|---|---|---|
| 1 | 52.2 | DER 331-J | 47.8 | 1.0 | 42.5 | 1875 | 22.6 | 53.0 |
| 2 | 56.7 | DER 331-J | 43.3 | 1.3 | 44.8 | 1970 | 24.8 | 55.5 |
| 3 | 34.3 | Epikote 1001 | 65.7 | 1.0 | 46.3 | 2063 | 6.0 | 13.0 |

In addition, the result of conducting the flame retardant test on a laminate prepared from 9 sheets of prepreg cloths the same as those used for producing Laminate 3 in the above table showed that the sample passed UL 94 V-O and also the mean burning time was 3 seconds (maximum 6 seconds).

EXAMPLE 4

A sample piece of a thickness of 0.5 mm and 100 mm was prepared in the same way as in Example 3 from 3 sheets of prepreg cloths the same as those prepared in Example 3 using Epikote 1001. The volume resistivity of the sample under no special conditions and after boiling in distilled water for 2 hours was measured. The results obtained are shown in Table 6.

Table 6

| Treatment | Water Absorption | Volume Resistivity |
|---|---|---|
|  | (%) | (Ω.cm) |
| No Special Condition | — | $5.4 \times 10^{15}$ |
| Boiling | 0.46 | $1.8 \times 10^{14}$ |

EXAMPLE 5

A mixture of brominated poly-p-hydroxystyrene as in Example 1 and poly-p-hydroxystyrene having a mean molecular weight of 6500 in a weight ratio of 1:1 was mixed with DER 331-J so that the equivalent ratio was 1 (46.2% of the mixture of brominated poly-p-hydroxystyrene and poly-p-hydroxystyrene and 53.8% of DER 331-J) and after adding further 1.0 phr of p-dimethylaminobenzaldehyde to the mixture, the resultant mixture was dissolved in acetone to provide a 50% solution of the mixture.

In the same way as in Example 3, prepreg cloths were prepared using the solution and a laminate was prepared from 9 sheets of the prepreg cloths.

The laminate was subjected to a flame retardant test and the results obtained showed that the mean burning time was 10 seconds (maximum 19 seconds) and the sample passed UL 94 (V-1).

EXAMPLE 6

In 95 parts by weight of acetone were dissolved 34.0 parts by weight of brominated poly-p-hydroxystyrene having a mean molecular weight of 13,000 and a bromine content of 51.7%, 66.0 parts by weight of a bis-phenolic epoxy resin, Epikote 1001 (having an epoxy equivalent of 475), and 1.0 phr of p-dimethylaminobenzaldehyde to form a varnish. A glass cloth (KS-1600/S-920L made by Kanebo-Stevens Co.) was immersed in the varnish thus prepared and after allowing the impregnated cloth to stand for 4 hours at room temperature, to provide a resin composition-impregnated base material.

Four or nine sheets of the prepreg cloths thus prepared were precured for 20 minutes at 150° C, laminated, pressed for 15 minutes at 160° to 170° C under a pressure of 50 kg/cm², and then post-cured for 105 minutes at 170° C in an oven to provide laminates having a thickness of 0.8 mm or 1.6 mm, respectively.

Test pieces were cut from each of the laminates thus prepared and the electrical properties of the sample pieces were measured. The results obtained are shown in Table 7.

Table 7

| Property | 20° C |
|---|---|
| Dielectric Breakdown Strength (KV/mm) | 29.3 |
| Insulation Resistance (Ω) | $2.5 \times 10^{14}$ |
| Insulating Resistance (Ω) -After boiling for 2 hours | $0.8 \times 10^{10}$ |
| Surface Resistance (Ω) | $1.3 \times 10^{14}$ |
| Surface Resistance (Ω) -After boiling for 2 hours | $0.9 \times 10^{12}$ |
| Volume Resistivity (Ω.cm) | $5.4 \times 10^{15}$ |
| Volume Resistivity (Ω.cm) -After boiling for 2 hours | $4.2 \times 10^{12}$ |
| Dielectric Constant (1 MHZ) | 5.3 |
| Dielectric Constant-Dissipation Factor (1 MHZ) | $3.0 \times 10^{-2}$ |
| Arc Resistance (RH 60%) (second) | 156 |
| Water Absorption (%) after Boiling for 2 Hours | 0.42 |

EXAMPLE 7

Copper-clad laminates clad on both surfaces and copper-clad laminates clad on only one surface were prepared using the following three kinds of resin compositions. That is, brominated poly-p-hydroxystyrene having a mean molecular weight of 13,000 and a bromine content of 51.7% or brominated poly-p-hydroxystyrene having a mean molecular weight of 10,900 and a bromine content of 41.5% was mixed with an epoxy resin such as a bis-phenolic epoxy resin, Epikote 1001 (made by Shell Chemical Corp.), a novolac type epoxy resin, Epikote 154 (made by Shell Chemical Corp.), and an alicyclic epoxy resin, CX-221 (made by Chisso Co.) so that the phenolic hydroxyl group/epoxy equivalent was 1 and after adding 1 phr of p-dimethylaminobenzaldehyde to the mixture, the resultant mixture was dissolved in a definite amount of acetone to provide a varnish. A glass cloth as described in Example 6 was immersed in each of the varnishes and then the impregnated cloth was allowed to stand for 4 hours at room temperature. Thus, three kinds of the resin-impregnated base materials, that is, prepreg cloths, were prepared. Nine sheets of each kind of the prepreg cloths were laminated and a copper foil of a thickness of 35 microns (Furukawa Circuit Foil) was placed on one side or on both sides of the laminate followed by press-molding of the laminates by heating under pressure under the conditions as shown in Table 8 to provide copper clad laminates of a thickness of 1.6 mm. The laminates were then post-cured for 2 hours at 170° C.

When the properties of the copper clad laminates thus obtained were measured, the results shown in Table 9 were obtained. The solder float was measured for the both-surface copper clad laminates and the peeling strength in a direction perpendicular to the plane of the laminate and other properties were measured for the one-surface copper-clad laminates. In this case, however, the volume resistivity and the flame retardant property were measured for the laminate after stripping off the copper foil or foils.

Table 8

| Sample No. | Resin Composition (wt. parts) | | Accelerator | Acetone (weight parts) |
|---|---|---|---|---|
|  | Br-PHS | Epoxy Resin |  |  |
| 1 | 34.0 (bromium content: 51.7%) | Epikote 1001  66.0 | 1 phr | 95 |

Table 8-continued

| | | | | | |
|---|---|---|---|---|---|
| 2 | 53.7 (bromium content: 41.5%) | Epikote 154 | 46.3 | 1 phr | 100 |
| 3 | 60.0 (bromium content: 41.5%) | CX-221 | 40.0 | 1 phr | 75 |

| Sample No. | Heating and pressing conditions | Resin content of laminate (wt.%) |
|---|---|---|
| 1 | 160–170° C/50Kg/cm²/15 min. | 37 |
| 2 | 150–160° C/50Kg/cm²/30 min. | 40 |
| 3 | 160–170° C/50Kg/cm²/20 min. | 35 |

Table 9

| Sample No. | | 1 | 2 | 3 |
|---|---|---|---|---|
| Solder float (min.) ... 280° C | | 10< | 30< | 5< |
| Peel strength in the direction perpendicular to the plane (Kg/cm) | | 1.74 | 1.50 | 1.63 |
| Peel strength after solder float (Kg/cm) | | 1.70 | 1.45 | 1.58 |
| Volume resistivity after boiling for 2 hours (Ω.cm) | | $4.2 \times 10^{13}$ | $5.3 \times 10^{12}$ | $3.5 \times 10^{13}$ |
| Flame retarding properties* | | | | |
| JIS C-6481 | Burning time (sec.) | 3 | 2.5 | 2.0 |
| | Burning distance (mm) | 11 | 7 | 7 |
| UL 492 | Burning time (sec.) | 3(max. 6) | 2(max. 4) | 2(max. 3) |

Note:
*passed UL 94 (V-O)

EXAMPLE 8

After mixing 46.2 parts by weight of a mixture of brominated poly-p-hydroxystyrene (having a mean molecular weight of 13,000 and a bromine content of 51.7%) and poly-p-hydroxystyrene having a mean molecular weight of 6500 (1:1 by weight ratio) with 53.8 parts by weight of a bisphenolic epoxy resin, DER 331-J (having an epoxy equivalent of 189) so that the equivalent ratio was 1, 1.0 phr of p-dimethylbenzaldehyde was added to the mixture and then the resultant mixture was dissolved in 100 parts by weight of acetone to provide a varnish. Copper clad laminates were prepared in the same way as in producing Laminate No. 1 in Example 7 using the varnish and the properties of the laminates were measured. The results obtained are shown in Table 10.

Table 10

| | |
|---|---|
| Solder Float at 280° C (min) | 20< |
| Peel Strength in the Direction Perpendicular to the Plane thereof (kg/cm) | 1.85 |
| Peel Strength after Solder Float (kg/cm) | 1.75 |
| Volume Resistivity (Ω.cm) after Boiling for 2 Hours | $1.5 \times 10^{13}$ |

EXAMPLE 9

Copper clad laminates were prepared in the same way as in Example 7 using a composition of brominated poly-p-hydroxystyrene and Epikote 1001 and also 2.0 phr of dicyandiamide in place of the p-dimethylaminobenzaldehyde as the hardening accelerator. In this case, however, the laminate assemblies were pressed for 5 minutes at 180° C under a pressure of 50 kg/cm² and then post-cured for 120 minutes at 180° C under pressure. The properties obtained of the laminates are shown in Table 11.

Table 11

| | |
|---|---|
| Solder Float at 300° C (min) | 10< |
| Peel Strength in the Direction Perpendicular to the Plane Thereof (kg/cm) | 1.45 |
| Peel Strength after Solder Float (kg/cm) | 1.40 |
| Volume Resistivity (Ω.cm) after Boiling for 2 Hours | $3.5 \times 10^{12}$ |

EXAMPLE 10

After adding 0.5 phr of p-dimethylbenzaldehyde to a composition prepared by mixing 31.7 parts of brominated poly-p-hydroxystyrene having a mean molecular weight of 7700 and a bromine content of 41.5%, 20.3 parts by weight of poly-p-hydroxystyrene having a mean molecular weight of 6500, and 50.0 parts by weight of a brominated bisphenolic epoxy resin, DER 511, having an epoxy equivalent of 478 and a bromine content of 19%, so that the equivalent ratio was 1, the resultant mixture was dissolved in 100 parts by weight of acetone to provide a varnish. Then, using the varnish, copper clad laminates were prepared in the same way as in producing Laminate No. 1 in Example 7 and the properties of the laminates were measured. The results obtained are shown in the following table.

Table 12

| | |
|---|---|
| Solder Float at 260° C (min) | 20< |
| Peel Strength in the Direction Perpendicular to the Plane Thereof (kg/cm) | 1.80 |
| Peel Strength after Solder Float (kg/cm) | 1.68 |
| Volume Resistivity (Ω.cm) after Boiling for 2 Hours | $3.3 \times 10^{12}$ |
| Flame Retardant Property- JIS C 6481 | 2 sec (burning time) |
| | 8 mm (burning dist.) |
| UL 94 | 2 sec (max. 4 sec.) |

Table 12-continued

Passed V-O

While the invention has been described in detail and with reference to specific embodiments thereof, it will be apparent to one skilled in the art that various changes and modifications can be made therein without departing from the spirit and scope thereof.

What is claimed is:

1. A metal clad laminate comprising at least one base material impregnated with a flame resistant thermosetting resin and a metal sheet or foil laminated on at least one side of said base material, said thermosetting resin composition comprising:
   i. an epoxy resin comprising an epoxy compound having at least two epoxy groups per molecule, and
   ii. a halogenated polyhydroxystyrene or a mixture of a halogenated polyhydroxystyrene and polyhydroxystyrene, wherein the halogenated polyhydroxystyrene has a mean degree of polymerization of from about 2 to 10,000 and the equivalent ratio of the number of hydroxyl groups in the halogenated polyhydroxystyrene and polyhydroxystyrene to the number of epoxy groups in the epoxy resin is in the range of 0.3 to 10.

2. The metal clad laminate as claimed in claim 1, wherein said halogenated polyhydroxystyrene has a halogen content of about 15 to 70% by weight.

3. The metal clad laminate as claimed in claim 1, wherein said halogenated polyhydroxystyrene is a brominated polyhydroxystyrene.

4. The metal clad laminate as claimed in claim 1, wherein said epoxy resin is a bisphenol type epoxy resin, a novolac type epoxy resin, a resole type epoxy resin, a polyphenol type epoxy resin, a polyhydroxybenzene type epoxy resin, a polyglycol type epoxy resin, an aromatic carboxylic acid type epoxy resin, an aliphatic carboxylic acid type epoxy resin, an alicyclic epoxy resin, a nitrogen-containing epoxy resin, a diene type epoxy resin, or a metal-containing epoxy resin.

5. The metal clad laminate as claimed in claim 1, wherein said thermosetting resin composition further contains a hardening accelerator.

6. The metal clad laminate as claimed in claim 5, wherein said hardening accelerator is dimethylaminobenzaldehyde, dimethylbenzylamine, triethanolamine, diethylenetriamine, urea, dicyandiamide, or dimethylformamide.

7. The metal clad laminate as claimed in claim 1, wherein said metal sheet or foil is a copper sheet or foil.

8. The metal clad laminate as claimed in claim 1, wherein said base material impregnated with said thermosetting resin composition is a paper, a glass cloth, or an asbestos paper.

9. The metal clad laminate as claimed in claim 1, wherein said equivalent ratio is 0.5 to 5.

10. The metal clad laminate as claimed in claim 1, wherein said thermosetting resin composition further comprises a plasticizer in an amount of from 0.5 to 20 weight % based on the weight of the resins in the composition.

11. The metal clad laminate as claimed in claim 1, wherein an adhesive is present between said base material and said metal sheet or foil to effect said lamination.

* * * * *